(12) United States Patent
Teng et al.

(10) Patent No.: US 7,705,673 B2
(45) Date of Patent: Apr. 27, 2010

(54) OVER-CURRENT SENSING DURING NARROW GATE DRIVE OPERATION OF CLASS D OUTPUT STAGES

(75) Inventors: James Teng, Jackson, MS (US); Qiong M. Li, Allen, TX (US); Cetin Kaya, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 91 days.

(21) Appl. No.: 11/970,289

(22) Filed: Jan. 7, 2008

(65) Prior Publication Data

US 2009/0174485 A1 Jul. 9, 2009

(51) Int. Cl.
*H03F 21/00* (2006.01)
(52) U.S. Cl. ............... 330/207 P; 330/251; 330/298
(58) Field of Classification Search ................. 330/10, 330/136, 207 A, 251, 29, 207 P, 298
See application file for complete search history.

(56) References Cited

U.S. PATENT DOCUMENTS 5,973,368 A * 10/1999 Pearce et al. ............. 330/251
7,265,617 B2 * 9/2007 Ohkuri .................... 330/207 A

* cited by examiner

*Primary Examiner*—Khanh V Nguyen
(74) *Attorney, Agent, or Firm*—John J. Patti; Wade J. Brady, III; Frederick J. Telecky, Jr.

(57) ABSTRACT

Two transistors of a class D output stage are driven by complementary, variable duty cycle signals PWM+ and PWM−. When the pulse width of the PWM+ signal becomes too narrow for reliable operation of prior art over-current protection circuits sensing the drain to source voltage of FET1 driven by PWM+, a Narrow Pulse Detector generates a signal indicative of this narrow pulse condition. A Negative Current Sense circuit measures the drain to source voltage across FET2 during the much longer conduction time of FET2 driven by PWM−. Because of the energy stored in the series inductor coupled to the output of the class D stage, a negative current flows through this FET2 during its conduction time. The resulting drain to source voltage of FET2 is measured and compared to a threshold. If the voltage indicative of current is over the threshold, and the Narrow Pulse Detector output indicates a narrow pulse condition, then an inhibit signal is generated which reduces current. A second Negative Current Sense circuit is utilized to similarly detect over-current conditions when the pulse width of PWM− becomes too narrow for reliable operation of prior art over-current protection circuits, thus protecting both FETs in the class D output stage from excessive current.

12 Claims, 3 Drawing Sheets

OVER-CURRENT SENSING DURING NARROW GATE DRIVE OPERATION OF CLASS D OUTPUT STAGES

BACKGROUND OF THE INVENTION

1. Field of the Invention

This invention relates generally to over-current sensing and protection of electronic circuits, and more specifically to sensing an over-current condition in a transistor of a half-bridge class D power output stage when its PWM gate drive pulse is so narrow that normal over-current sensing is too slow to detect the over-current condition.

2. Description of the Related Art

Many electronic circuits employ power output stages having bipolar or field effect transistors (FETs) in a half-bridge configuration, often referred to as a class D output stage. In a class D topology, the collector or drain of a first transistor is coupled to the supply voltage PVDD, the emitter or source of a second transistor is coupled to ground, and the emitter or source of the first transistor is coupled to the collector or drain of the second transistor and also to a first terminal of an inductor. The second terminal of the inductor is coupled to a load resistance to ground and to a filter capacitor to ground. Hereinafter, the term FET will be used to refer to a transistor, recognizing that the circuits described may also be realized with bipolar transistors. The FET coupled to PVDD shall be referred to herein as the high side FET, and the FET coupled to ground shall be referred to as the low side FET.

By driving the gates of the FETs of a class D output stage with complementary pulse-width-modulated (PWM) signals sometimes referred to as PWM+ and PWM−, one or the other FET is turned on, coupling either PVDD or ground through the very low resistance of that FET to the load through the inductor. The opposite FET is turned off by its complementary gate drive signal. The filtering action of the inductor and capacitor smooth the pulsating current to the load. By varying the pulse width of the gate drive pulses, the resulting voltage applied to the load may be varied.

One type of circuit using this output stage is a switching voltage regulator, which measures the voltage present at the output, compares it to a desired reference voltage, and adjusts, by use of a feedback loop, the duty cycle of the PWM gate drive signal so as to drive the output voltage to the desired value even as load current and PVDD change. Another application for such an output stage is in Class D audio amplifier circuits, which operate in a manner similar to a switching voltage regulator but which cause the output voltage to follow an input AC audio signal rather than a DC reference voltage. Such amplifiers are typically very efficient, since the output FETs are either off or fully on, dissipating little power in either state.

Various methods for sensing excessive current flowing in the "on" FET have been developed, which typically trigger over-current shutdown of the output circuits to prevent damage to the FETs or other portions of the circuitry. The positive current flowing in a FET is typically measured during the time the gate drive pulse turns on the FET. If an over-current condition during the on time is detected, succeeding pulses may be skipped to allow the current to decrease below the over-current threshold. In the context of this document, positive current shall refer to current flowing from PVDD through the high side FET to the output, or flowing from the output to ground through the low side FET. Negative current shall refer to current flowing in the opposite direction through either FET. Known over-current sensing typically occurs during the time of positive current flow.

However, because of the limited speed of sensing and operation of some of these over-current protection circuits, they may operate unreliably or not at all when the gate drive pulse becomes very narrow. An apparatus and method for providing over-current sensing and protection even with very narrow gate drive pulses is therefore desirable, and is an object of the present invention.

SUMMARY OF THE INVENTION

The invention provides a method and apparatus for sensing an over-current condition in a FET of a class D output stage, even when the gate drive for the FET is so narrow that prior art over-current sensing circuits have too little time to reliably detect the over-current condition.

In a preferred embodiment of the invention described in greater detail below, a narrow pulse detector measures the pulse width of a PWM gate drive pulse which is driving the gate of a first FET in a class D output stage, and compares it to a width threshold. If the pulse width is above the width threshold, the output of the narrow pulse detector causes the logical selection and use of a known-art positive over-current sensing circuit to determine if the current is above a threshold. If the pulse width driving the first FET falls below the threshold, the narrow pulse detector output causes the logical selection and use of a novel negative current sensor coupled to the second FET. This negative current sensor measures the negative current flowing through the second FET during its conduction time, which is complementary to the conduction time of the first FET and so is long compared to the conduction time of the first FET driven by the narrow pulse. The negative current flow in the second FET during its conduction time is caused by the stored energy in the inductance of the output filter, and is substantially equal to the total current being delivered to the output. The over-current condition is thereby sensed in spite of the narrow gate drive pulse.

A significant advantage of the described embodiments is that over-current protection for the output stage is active even during operation with very narrow gate drive pulses.

Further benefits and advantages will become apparent to those skilled in the art to which the invention relates.

DESCRIPTION OF THE VIEWS OF THE DRAWINGS

Throughout the drawings, like elements are referred to by like numerals.

DETAILED DESCRIPTION

Figure 1:
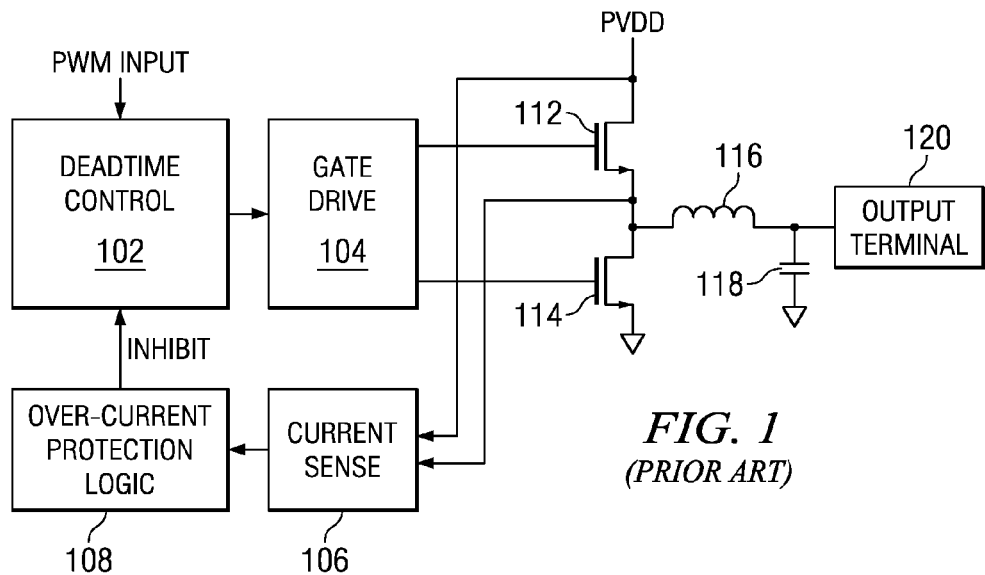
FIG. 1 (prior art) shows a block diagram of a class D output stage, including a Current Sense circuit, sensing positive current flow, for over-current detection.

In FIG. 1, the output stage of a class D amplifier comprises Deadtime Control 102, Gate Drive 104, Current Sense 106, Over-Current Protection Logic 108, output FET 112, output FET 114, inductor 116, capacitor 118, and Output Terminal 120.

A PWM signal from a known PWM generator is coupled to the PWM

Input of Deadtime Control 102, which has an output coupled to a control input of Gate Drive 104. Deadtime Control 102 also has a second inhibit input. Gate Drive 104 has a first output coupled to the gate of FET 112, and a second output coupled to the gate of FET 114. FET 112 has a drain terminal coupled to the power supply terminal PVDD and a source coupled to the drain of FET 114 and to a first terminal of inductor 116. The source of FET 114 is coupled to ground. The source and drain terminals of FET 112 are coupled to two inputs of Current Sense 106. The output of Current Sense 106 is coupled to a first input of Over-Current Protection Logic 108. The output of Over-Current Protection Logic 108 is coupled to the inhibit input of Deadtime Control 102. The second terminal of inductor 116 is coupled to a first terminal of capacitor 118 and to the Output Terminal 120. The second terminal of capacitor 118 is coupled to ground.

In operation and in a known manner, a PWM signal is input to Deadtime Control 102, which modifies this PWM signal responsive to the signal at the inhibit input of Deadtime Control 102. In the absence of an inhibit signal, the PWM signal is changed to two complementary PWM signals at the two outputs of Gate Drive 104. A first PWM signal then drives the gate of high-side FET 112, while the complementary PWM signal drives the gate of low-side FET 114. In this manner, substantially only one of the two FETs is allowed to be conducting at a given time. Gate Drive 104 also level shifts in a known manner the complementary PWM signals to properly drive each FET gate. As the FETs are turned on or off at a rapid rate, typically hundreds of Kilohertz to many Megahertz, current from PVDD through FET 112 or to ground through FET 114 is coupled through the filter comprising inductor 116 and capacitor 118 to the Output Terminal 120, to which in operation is connected a load being driven.

The drain to source voltage of FET 112 is present at the two inputs of Current Sense 106. During conduction, FET 112 operates in the linear region and thus appears as a (typically very low) resistance through which the current is flowing to the output terminal. The resulting drain-source voltage drop is therefore proportional to current flow, and is typically amplified and converted from a differential signal to a single-ended signal in Current Sense 106. This amplified signal, responsive to and representative of current flow through FET 112 to the output terminal, is compared in Current Sense 106 to a threshold. If the output current (as represented by this voltage) exceeds this threshold, an output signal from Current Sense 106 coupled to the input of Over-Current Protection Logic 108 causes Over-Current Protection Logic 108 to generate an inhibit output. This inhibit signal, coupled to the inhibit input of Deadtime Control 102, modifies the PWM signal coupled to Gate Drive 104 so as to reduce the conduction time of FET 112 and thus to reduce output current flow until it is below the threshold. In typical Current Sense 106 and Over-Current Protection Logic 108 circuits, a minimum pulse width of the PWM signal, hence a minimum time of current flow through the FET, is required to give these circuits time to react to the over-current. In some cases, when this PWM pulse width becomes too narrow, the over-current sensing no longer operates as it should, and damaging currents may continue to flow.

Those skilled in the art will recognize that various ways to measure FET current have been developed, which typically can measure current only during the time the FET is on. Many different Current Sense 106 circuits have been developed. It will also be recognized that, while the source of FET 114 is shown coupled to ground, alternative class D stages couple this terminal instead to a negative voltage. Other known class D topologies interchange the drain and source terminals of one or more of the output FETs, with substantially identical function.

Figure 2:
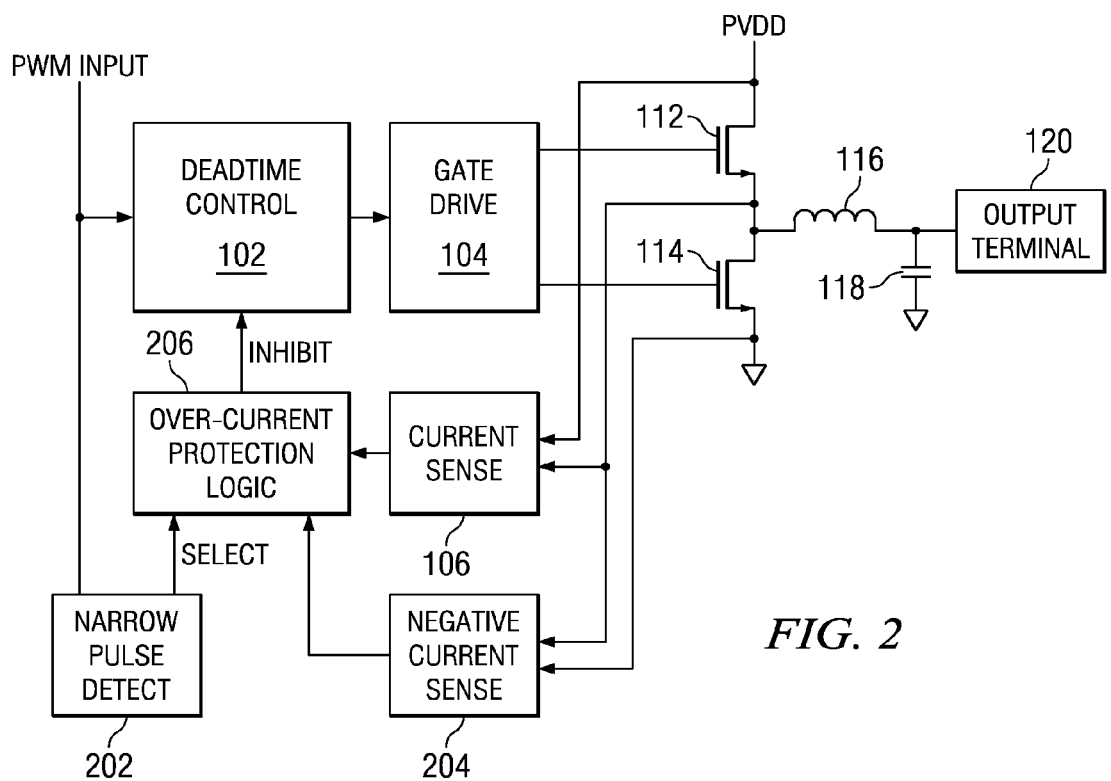
FIG. 2 shows a block diagram of a class D output stage of FIG. 1, with the addition of a Negative Current Sense circuit and a Narrow Pulse Detect circuit.

In FIG. 2, the circuit elements as described in FIG. 1 are coupled as in FIG. 1, and additional circuitry is added in a novel manner, comprising Narrow Pulse Detect 202, Negative Current Sense 204, and Over-Current Protection Logic 206 which replaces Over-Current Protection Logic 108. The PWM signal coupled to the input of Deadtime Control 102 is also coupled to the input of Narrow Pulse Detect 202, which has an output coupled to a third select input of Over-Current Protection Logic 206. First and second inputs of Negative Current Sense 204 are coupled to the drain and source of FET 114, respectively. The output of Negative Current Sense 204 is coupled to a second input of Over-Current Protection Logic 206, which has a first input and an output coupled as described above for FIG. 1.

In operation, Narrow Pulse Detect 202 compares the width of the PWM pulse at its input with a threshold value, and provides at its output a signal indicative of narrow pulse when the pulse width is less than this threshold. This output signal, when the PWM pulse width is below the width threshold, causes the logical coupling, through Over-Current Protection Logic 206, of the output signal of Negative Current Sense 204 to the Inhibit input of Deadtime Control 102. If the output stage is operating in a condition wherein current is being sourced to the output terminal through FET 112 during the short conduction time of FET 112, then during conduction of FET 114 in the complementary portion of the overall period, negative current flows through FET 114 due to the stored energy in Inductor 116. During this conduction of negative current, FET 114 operates in the linear region and thus appears as a (typically very low) resistance through which current is flowing from ground to the output terminal. The resulting drain-source voltage drop is therefore proportional to current flow, and is typically amplified and converted from a differential signal to a single-ended signal in Negative Current Sense 204. This amplified signal, representative of current flow to the output terminal, is compared in Negative Current Sense 204 to a threshold. If the output current (as represented by this voltage) exceeds this threshold, and if the output of Narrow Pulse Detect 202 is indicative of a narrow pulse condition, the output signal from Negative Current Sense 204 to the second input of Over-Current Protection Logic 108 causes Over-Current Protection Logic 108 to generate an inhibit output which is coupled to Deadtime Control 102, reducing the current flow as described above.

When the PWM pulse width is above the width threshold, the output of Current Sense 106, rather than the output of Negative Current Sense 204, is logically coupled, through Over-Current Protection Logic 206, to the inhibit input of Deadtime Control 102. In this manner, over-current protection is active for either normal or narrow PWM pulse width operation.

Because the gate drive signals, and hence the conduction times of the FETS 112 and 114 are complementary, during a narrow pulse situation in which the gate drive to FET 112 is narrow, the complementary gate drive to FET 114 is nearly the full period of the gate drive signal. The Negative Current Sense 204 thus has sufficient time to measure and compare to a threshold the negative current, as described above. Negative current sense is described more fully in copending U.S. patent application Ser. No. 11/339,786, entitled "Transistor Overcurrent Detection Circuit with Improved Response Time," by Cetin Kaya, James Teng and Claus Neesgaard, filed on Jan. 25, 2006, which is commonly assigned, and which is hereby incorporated by reference herein.

It will be apparent to those skilled in the art that the topology described above operates in the presence of a narrow gate drive pulse to the high-side FET 112, such as might be encountered with a short from Output Terminal 120 to ground. When it is desired to protect against a short from Output Terminal 120 to the PVDD supply, a Current Sense 106 circuit is coupled across the drain and source of FET 114, to sense its current in the normal direction, and a Negative Current Sense 204 circuit is coupled across FET 112, to sense its negative current when the gate drive to FET 114 is narrow. Operation of this topology is substantially as described above.

Figure 3:
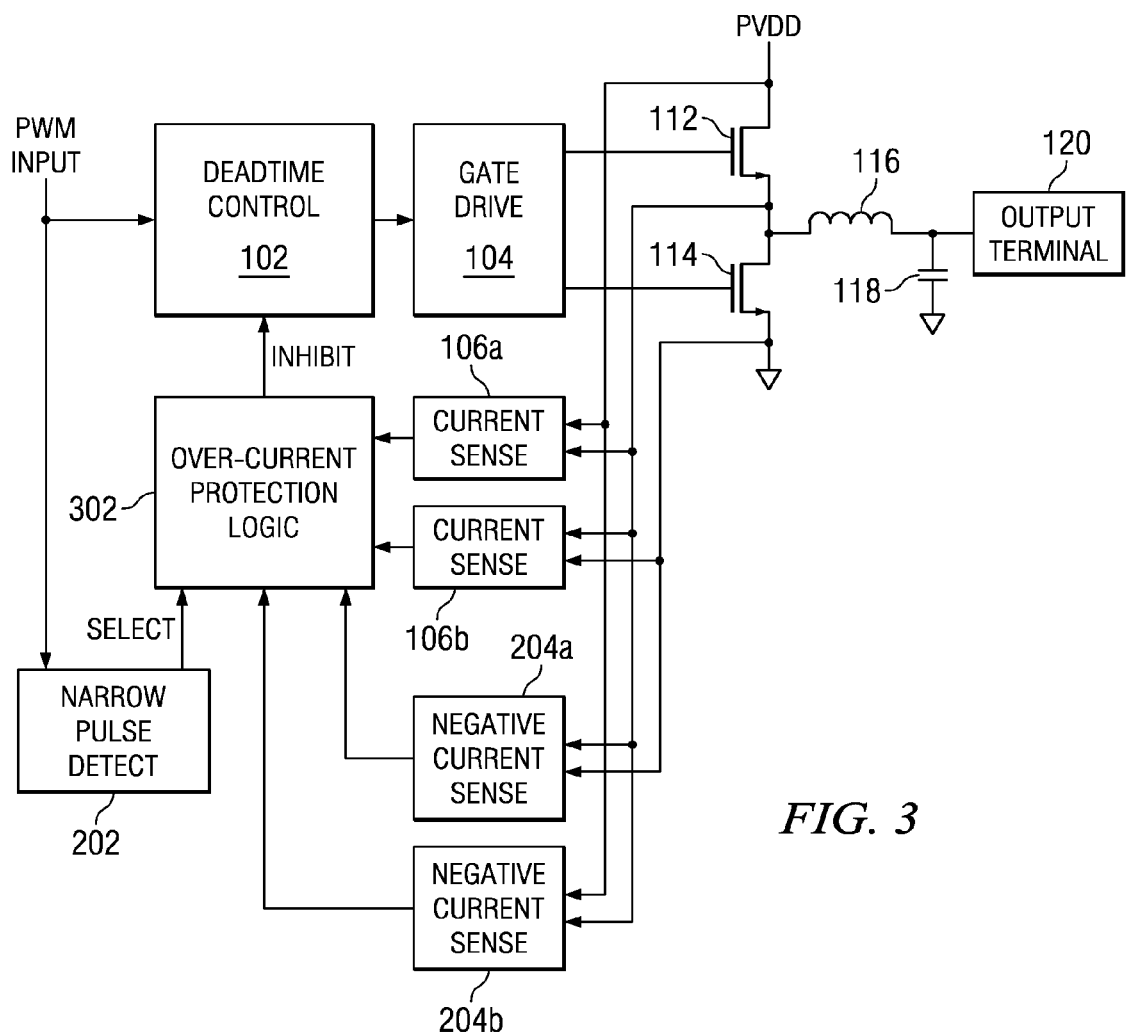
FIG. 3 shows the block diagram of FIG. 2 with additional Current Sense and Negative Current Sense circuits to detect over-current conditions in either FET during normal or narrow-pulse operation.

In FIG. 3, the topology of FIG. 2 further comprises a second Current Sense 106b, with its inputs coupled to the drain and source of FET 114, a second Negative Current Sense 204b, with its inputs coupled to the drain and source of FET 112, and an Over-Current Protection Logic 302 having five inputs rather than the three inputs of the Over-Current Protection Logic 206 of FIG. 2. The two outputs of the Current Sense 106a and 106b circuits and the two outputs of the Negative Current Sense 204a and 204b circuits are coupled to four respective inputs of Over-Current Protection Logic 302. The output of Narrow Pulse Detect 202 is coupled to a fifth input of Over-Current Protection Logic 302. The remainder of the circuit elements are connected and operate as described in FIG. 2. Current Sense 106a is substantially identical to Current Sense 106 of FIG. 2; Negative Current Sense 204a is substantially identical to Negative Current Sense 204 of FIG. 2.

In operation and with the PWM pulse width wider than the narrow pulse threshold, an over-current condition, either from Output Terminal 120 being shorted to ground or to the PVDD supply, is sensed by one of the two Current Sense 106a or 106b circuits, which provides an output fault signal to the respective inputs of Over-Current Protection Logic 302. The output of the Narrow Pulse Detector 202, in the state indicative of a non-narrow pulse condition, causes Over-Current Protection Logic 302 to utilize signals output from Current Sense 106a and 106b, ignoring signals from outputs of Negative Current Sense 204a or Negative Current Sense 204b. An over-current condition as described above, but with the PWM pulse width narrower than the narrow pulse threshold, is sensed by one of the Negative Current Sense 204a or 204b circuits, which provides an output fault signal to the respective inputs of Over-Current Protection Logic 302. The output of the Narrow Pulse Detector 202, in the state indicative of a narrow pulse condition, causes Over-Current Protection Logic 302 to utilize the signals from Negative Current Sense 204a and 204b, ignoring signals from outputs of Current Sense 106a or Current Sense 106b. In this manner, an over-current condition in either FET, and during either normal or narrow pulse conditions, is sensed and causes an inhibit signal to be generated and applied to Deadtime Control 102, thereby reducing current flow.

Figure 4:
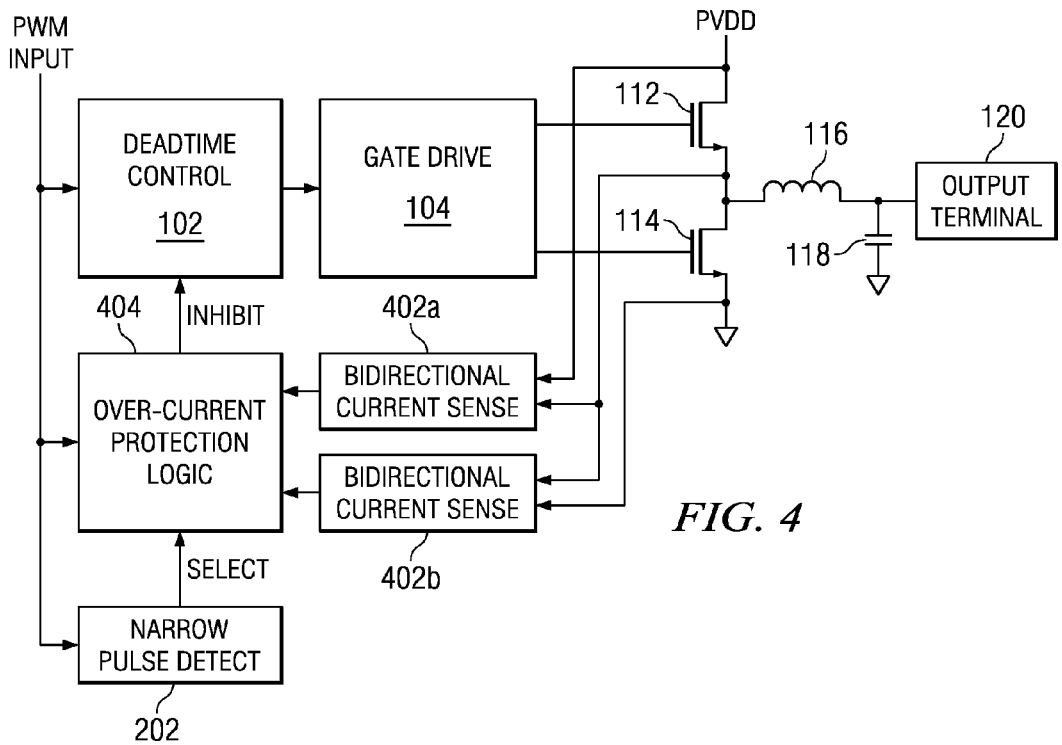
FIG. 4 shows a block diagram of a class D output stage having Bidirectional Current Sense circuits coupled to each FET, a Narrow Pulse Detector, and Over-current Protection Logic which selects that Bidirectional Current Sense measuring negative current during a narrow pulse condition.

In FIG. 4, a more generalized embodiment utilizes a bidirectional current sensor on each of FET 112 and FET 114. In FIG. 4, the circuit elements as described in FIG. 1 are coupled as in FIG. 1, and additional circuitry is added in a novel manner, comprising Narrow Pulse Detect 202, Bidirectional Current Sense 402a, Bidirectional Current Sense 402b, and Over-Current Protection Logic 404. The PWM signal coupled to the input of Deadtime Control 102 is also coupled to a fourth input of Over-Current Protection Logic 404 and to the input of Narrow Pulse Detect 202, which has an output coupled to a third input of Over-Current Protection Logic 404. First and second inputs of Bidirectional Current Sense 402a are coupled to the drain and source of FET 112, respectively. First and second inputs of Bidirectional Current Sense 402b are coupled to the drain and source of FET 114, respectively. The output of Bidirectional Current Sense 402a is coupled to a first input of Over-Current Protection Logic 404, and the output of Bidirectional Current Sense 402b is coupled to a second input of Over-Current Protection Logic 404.

In operation, Bidirectional Current Sense 402a and 402b measure the current flow during conduction and in either direction through the associated FET 112 or 114 respectively, and compare the absolute value of the current to a threshold. If the absolute value of current exceeds the threshold, an output is generated indicative of an over-current condition. This over-current condition output is coupled to Over-Current Protection Logic 404. Over-Current Protection Logic 404 also has inputs coupled as described to the Narrow Pulse Detect 202 output signal and the PWM Input signal, and so is logically aware of a narrow pulse condition and of the present phase of the PWM signal. When an over-current condition is indicated by the state of either Bidirectional Current Sense 402 output, Over-Current Protection Logic 404 logically utilizes the Narrow Pulse Detect 202 output signal to determine if a narrow pulse condition is present, and, if so, uses the PWM signal to determine the time period during which gate drive should be inhibited by the Deadtime Control 102, thereby reducing output current.

Figure 5:
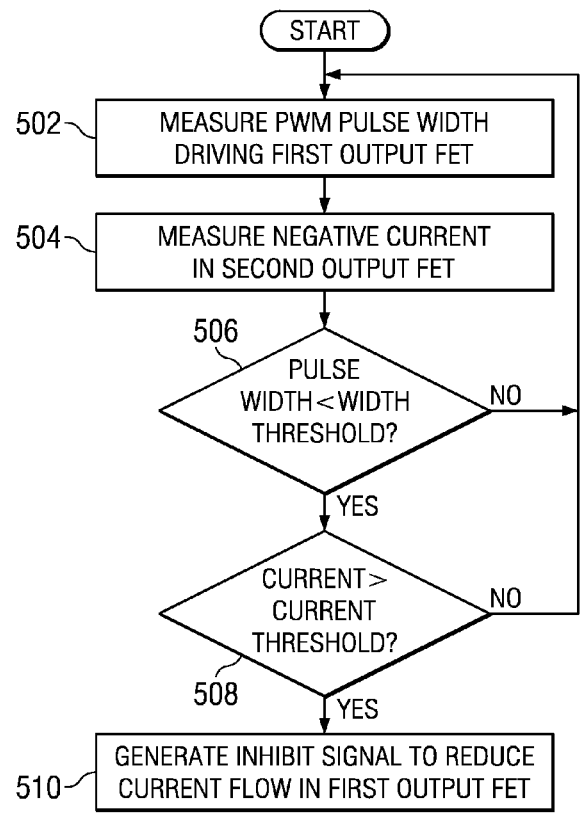
FIG. 5 is a flow chart showing a method for detecting an over-current condition in a first output FET by measuring negative current flowing in the second output FET.

In FIG. 5, a method is described for detecting an over-current condition in one FET of a class D output stage by measuring the negative current flowing in the second FET and comparing that current to a threshold.

At step 502, the pulse width of the PWM signal driving a first FET of the class D output pair is measured. At step 504, the negative current flowing in the second FET of the output pair is measured during the much longer conduction time of the second FET. At step 506, the measured pulse width from step 502 is compared to a width threshold, below which operation of positive current sensing becomes unreliable. If the pulse width is greater than the width threshold, process flow reverts to step 502. If the pulse width is less than the width threshold, process flow proceeds to step 508. At step 508, the negative current measured in step 504 is compared to a current threshold above which it is desired to reduce current flow. If the measured current is not greater than this current threshold, process flow reverts to step 502. If the measured current is above the current threshold, process flow proceeds to step 510. At step 510, an inhibit signal is generated which is coupled to an appropriate node within the circuit to reduce current flow in the output stage.

Those skilled in the art will recognize that many alternative logic circuit topologies will have substantially equivalent operation, and may be desirable in some embodiments. For example, the output of the Narrow Pulse Detect 202 might be coupled to an enabling input of a Negative Current Sense circuit, rather than to Over-Current Protection Logic 302. Similarly, the output of Over-Current Protection Logic 302 might be coupled to an added inhibit input of Gate Drive 104 rather than to the Deadtime Control 102. In many cases, the choice of logical interconnects and operation will depend on the desired action during an over-current condition. It is also obvious that there are many nodes within the typical stages of a class D circuit which are suitably responsive to an inhibit signal generated by Over-Current Protection Logic. For example, while the embodiments describe coupling the inhibit signal to the Deadtime Control circuit, it may also be coupled to a suitable node within the Gate Drive circuit, or even directly to the gate of the FET to be inhibited. The choice of node the inhibit signal is coupled to depends to some degree on the desired action during an over-current condition.

Those skilled in the art to which the invention relates will also appreciate that yet other substitutions and modifications can be made to the described embodiments, without departing from the spirit and scope of the invention as described by the claims below.

Many other alternatives to the circuits and sub circuits described are possible while retaining the scope and spirit of the invention.

What is claimed is:

1. An apparatus for detecting an over-current condition in a class D output stage having a high side FET and a low side FET coupled together between nodes of a power supply, the apparatus comprising:
 a narrow pulse detector coupled to a pulse-width-modulated (PWM) signal input of a deadtime control circuit operable to drive the FETs of the class D output stage, the narrow pulse detector operable to provide an output indicative of a narrow pulse condition if the pulse width of the PWM signal at the input of the deadtime control circuit falls below a predetermined width threshold; and
 a negative current sensor coupled to the low side FET in the class D output stage, wherein the negative current sensor includes a current sense and threshold comparator, and wherein the negative current sensor has an output coupled to over-current protection logic, and wherein during a condition of the PWM signal having a pulse width below the predetermined width threshold, the negative current sensor measures the negative current flow through the low side FET during its conduction time, compares the measured negative current to a first predetermined current threshold, and provides a signal to over-current protection logic indicative of the current exceeding or not exceeding the first predetermined current threshold.

2. The apparatus of claim 1, wherein the apparatus further comprises a second negative current sensor coupled to the high side FET in the class D output stage, wherein the second negative current sensor includes a second current sense and threshold comparator, and wherein the second negative current sensor has an output coupled to the over-current protection logic, and wherein during a condition of the PWM signal having a pulse width below the predetermined width threshold, the second negative current sensor measures the negative current flow through the high side FET during its conduction time, compares the measured negative current to a second predetermined current threshold, and provides a signal to over-current protection logic indicative of the current exceeding or not exceeding the second predetermined current threshold.

3. The apparatus of claim 2, wherein each of the negative current sensors measures the drain to source voltage across its associated FET during conduction time, and compares this voltage to a respective threshold voltage, and wherein an over-current condition causes the voltage to exceed the respective threshold voltage of the respective negative current sensor, thereby causing the respective negative current sensor to generate a signal to over-current protection logic indicative of the respective measured negative current exceeding or not exceeding the respective predetermined current threshold.

4. The apparatus of claim 2, wherein the apparatus further comprises:
 a first positive current sensor coupled to the high side FET, wherein the first positive current sensor is operable to measure a positive current flowing through the high side FET during its conduction time and to compare the current to a third predetermined current threshold, thereby generating a signal indicative of positive current flow in the high side FET being above or below the third predetermined current threshold;
 a second positive current sensor coupled to the low side FET, wherein the second positive current sensor is operable to measure a positive current flowing through the low side FET during its conduction time and to compare the current to a fourth predetermined current threshold, thereby generating a signal indicative of positive current flow in the low side FET being above or below the fourth predetermined current threshold; and
 the over-current protection logic having a first input coupled to the output of the first positive current sensor, a second input coupled to the output of the second positive current sensor, a third input coupled to the output of the first negative current sensor, and a fourth input coupled to the output of the second negative current sensor, and an output, which is responsive to one or more of the inputs, coupled to a deadtime control circuit, wherein during an over-current condition while the PWM pulse width is above the predetermined width threshold in the narrow pulse detector, the over-current condition is detected by one of the two the positive current sensors, the output of the positive current sensor causing the output of the over-current protection logic to enter a state which causes the deadtime control to modify the gate drive to reduce current and wherein during an over-current condition while the PWM pulse width is below the predetermined width threshold in the narrow pulse detector, the over-current condition is detected by one of the two the negative current sensors, the output of the comparator causing the output of the over-current protection logic to enter a state which causes the deadtime control to modify the gate drive to reduce current.

5. An apparatus for measuring current flow in a class D output stage having a high side FET and a low side FET coupled together between nodes of a power supply, the apparatus comprising:
 a first bidirectional current sensor coupled to the high side FET, wherein the first bidirectional current sensor is operable to provide an output indicative of the absolute value of current flow in the high side FET being above or below a first current threshold;
 a second bidirectional current sensor coupled to the low side FET, wherein the second bidirectional current sensor is operable to provide an output indicative of the absolute value of current flow in the low side FET being above or below a second current threshold;
 a narrow pulse detector coupled to an input of a deadtime control circuit that is operable to drive the FETs of the class D output stage, wherein the narrow pulse detector is operable to provide an output indicative of narrow pulse condition when a pulse width of a PWM signal at the input of the deadtime control circuit falls below a predetermined width threshold; and
 over-current protection logic having a first input coupled to receive the output of the first bidirectional current sensor, a second input coupled to receive the output of the second bidirectional current sensor, a third input coupled to receive the output of the narrow pulse detector, and a fourth input coupled to receive the PWM signal, and an output coupled to an inhibit input of the deadtime control circuit driving respective gates of the FETs, wherein during a condition of the PWM signal having a pulse width below the predetermined width threshold such that the respective bidirectional current sensor on one of the FETs has insufficient time to measure positive current flowing through it, the other respective bidirectional current sensor measures a negative current flowing through the other FET and compares the measured negative current to its respective current threshold, thereby generating an inhibit signal at the output of the over-current protection logic which causes the deadtime control circuit to modify its output gate drive signals during the appropriate phase of the PWM signal, thus reducing current in the appropriate FET if its current exceeds the threshold.

6. A method for sensing an over-current condition in a first output FET of a class D output stage, the method comprises:
  measuring the pulse width of a PWM signal driving the first output FET;
  measuring a negative current flowing in a second output FET;
  comparing the pulse width to a width threshold;
  comparing the negative current so as to measure a current threshold; and
  generating an inhibit signal, if the negative current exceeds the current threshold and the pulse width is below the width threshold, which causes a reduction in current flow in the first output FET, wherein, when the PWM pulse width driving the first output FET is below the width threshold, and the negative current flowing in the second output FET exceeds a threshold current, the inhibit signal is generated which causes a reduction in output current in the first output FET.

7. An apparatus comprising:
  a first voltage rail;
  a second voltage rail;
  a first FET that is coupled to the first voltage rail at its drain;
  a second FET that is coupled to source of the first FET at its drain and that is coupled to the second voltage rail at its source;
  a deadtime control circuit that receives a PWM signal;
  over-current protection logic that is coupled to the deadtime circuit, wherein the over-current protection logic is operable to provide an inhibit signal to the deadtime control circuit;
  a gate drive circuit that is coupled to the deadtime control circuit and to the gates of the first and second FETs;
  a narrow pulse detector that receives the PWM signal input and that is coupled to the over-current protection logic, wherein the narrow pulse detector indicates to the over-current protection logic whether a pulse width of the PWM signal is less than a predetermined width threshold; and
  a negative current sensor that is coupled to the second FET and the over-current protection logic, wherein the negative current sensor provides a signal to over-current protection logic indicative of whether a current across the second FET during conduction exceeds or does not exceed a predetermined current threshold when the pulse width is less than the predetermined width threshold.

8. The apparatus of claim 7, wherein the apparatus further comprises a second negative current sensor that is coupled to the first FET and the over-current protection logic.

9. The apparatus of claim 7, wherein the apparatus further comprises a positive current sensor that is coupled to the second FET and the over-current protection logic.

10. The apparatus of 9, wherein the apparatus further comprises a second positive current sensor that is coupled to the first FET and the over-current protection logic.

11. An apparatus comprising:
  a first voltage rail;
  a second voltage rail;
  a first FET that is coupled to the first voltage rail at its drain;
  a second FET that is coupled to source of the first FET at its drain and that is coupled to the second voltage rail at its source;
  a deadtime control circuit that receives a PWM signal;
  over-current protection logic that is coupled to the deadtime circuit, wherein the over-current protection logic is operable to provide an inhibit signal to the deadtime control circuit;
  a gate drive circuit that is coupled to the deadtime control circuit and to the gates of the first and second FETs;
  a narrow pulse detector that receives the PWM signal input and that is coupled to the over-current protection logic, wherein the narrow pulse detector indicates to the over-current protection logic whether a pulse width of the PWM signal is less than a predetermined width threshold; and
  a bidirectional current sensor that is coupled to the one of the first and second FETs and to the over-current protection logic, wherein the bidirectional current sensor provides a signal to over-current protection logic indicative of whether the absolute value of a current flowing in its associated FET is above or below a current threshold.

12. The apparatus of claim 11, wherein the current threshold further comprises a first and a second current thresholds, and wherein the bidirectional current sensor further comprises:
  a first bidirectional current sensor that is coupled to the first FET and the over-current protection logic, wherein the first bidirectional current sensor provides a signal to over-current protection logic indicative of whether the absolute value of a current flowing in the first FET is above or below the first current threshold; and
  a second bidirectional current sensor that is coupled to the second FET and the over-current protection logic, wherein the second bidirectional current sensor provides a signal to over-current protection logic indicative of whether the absolute value of a current flowing in the second FET is above or below the second current threshold.

* * * * *